United States Patent [19]

Suzuki

[11] Patent Number: 5,483,349
[45] Date of Patent: Jan. 9, 1996

[54] APPARATUS FOR DETECTING POSITIONS OF MARKS IN PROJECTION ALIGNER WHEREIN AN AUXILIARY PATTERN IS CONSTRUCTED TO PRODUCE A SIGNAL LEVEL THAT IS INDEPENDENT OF THE SURFACE CONDITION OF A SUBSTRATE

[75] Inventor: Kazuaki Suzuki, Kawasaki, Japan

[73] Assignee: Nikon Corporation, Tokyo, Japan

[21] Appl. No.: 412,089

[22] Filed: Mar. 28, 1995

Related U.S. Application Data

[63] Continuation of Ser. No. 884,127, May 18, 1992, abandoned.

[30] Foreign Application Priority Data

May 23, 1991 [JP] Japan ................................. 3-118476

[51] Int. Cl.⁶ .................................................. G01B 11/00
[52] U.S. Cl. ............................................ 356/401; 250/548
[58] Field of Search ................................. 356/400, 401; 250/548, 557

[56] References Cited

U.S. PATENT DOCUMENTS 4,679,942   7/1987   Suwa et al. .............................. 356/401

Primary Examiner—Richard A. Rosenberger
Assistant Examiner—Robert Kim
Attorney, Agent, or Firm—Shapiro & Shapiro

[57] ABSTRACT

An apparatus for detecting positions is provided with an auxiliary pattern adjacent to the opaque portion of an index pattern, which has a spatial frequency higher than the insulating spatial frequency of an imaging system in order to obtain a stable signal portion (slope). Using this slope, the positional information of the index pattern is obtained, and on the basis of the positional information, the positions of wafer alignment marks are detected.

10 Claims, 5 Drawing Sheets

FIG. 4A
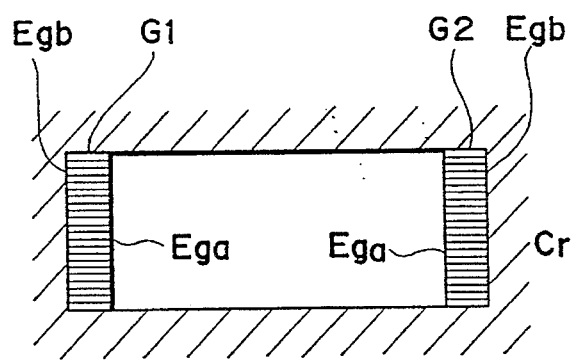
FIG. 4B
FIG. 4C
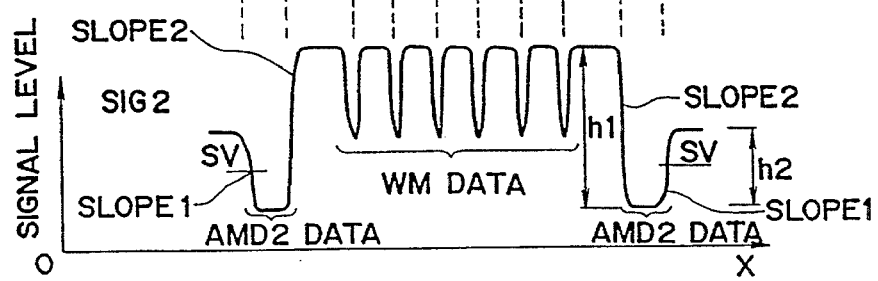

FIG. 6A
FIG. 6B
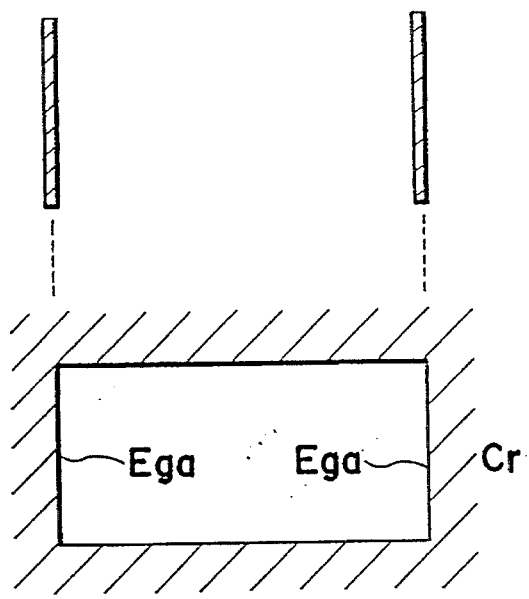
FIG. 6C
FIG. 6D
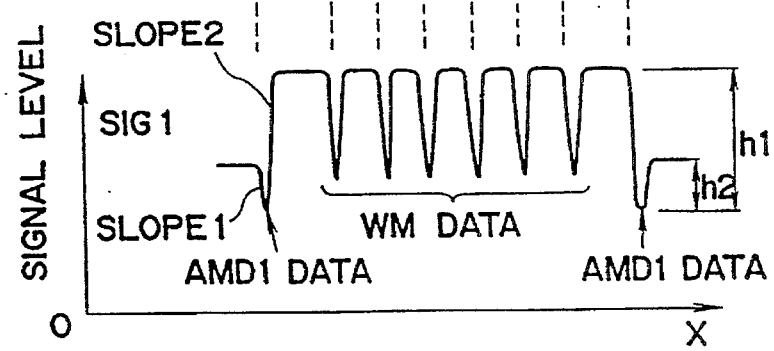
FIG. 6E
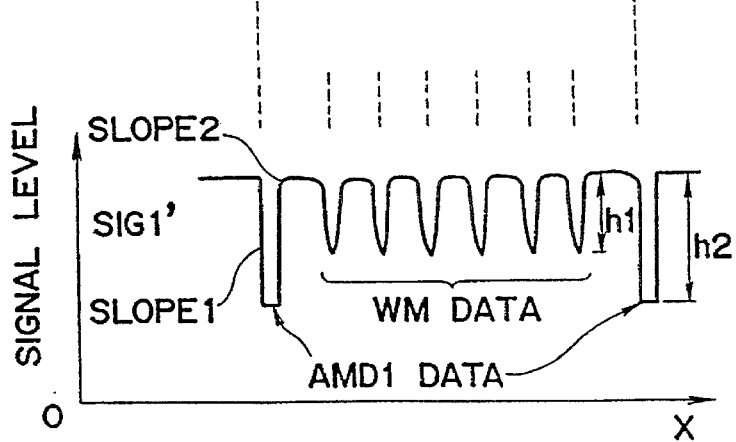

APPARATUS FOR DETECTING POSITIONS OF MARKS IN PROJECTION ALIGNER WHEREIN AN AUXILIARY PATTERN IS CONSTRUCTED TO PRODUCE A SIGNAL LEVEL THAT IS INDEPENDENT OF THE SURFACE CONDITION OF A SUBSTRATE

This is a continuation of application Ser. No. 07/884,127 filed May 18, 1992, now abandoned.

BACKGROUND OF THE INVENTION

1. Field of the Invention

The present invention relates to an apparatus for detecting positions. More particularly, the invention relates to an apparatus for detecting positions in a semiconductor aligner employed for the manufacturing process of semiconductor integrated devices, particularly of its lithography process.

2. Related Background Art

Traditionally, in an apparatus for detecting positions of an imaging detection type in a semiconductor aligner of the kind, the image of an interleaving mark (index pattern) on a reticle and the image of a wafer alignment mark are imaged on a image sensor through a projection optical system and imaging optical system, and a positional detection is performed on the basis of image signals which vary its level in accordance with the marking images from the image sensor (through-the-reticle method). Also, the index pattern on the index plate which is provided in a substantially conjugate relationship with a wafer in an alignment optical system through an objective optical system which is different from the projection optical system and the image of a wafer alignment mark are imaged on an image sensor through an imaging optical system, and a positional detection is performed on the basis of image signals which vary its level in accordance with each image of the marks and patterns from the image sensor (off axis method).

In reference to FIGS. 6A through 6E, the description will be made of a conventional apparatus for detecting positions.

At first, the through-the-reticle method will be described. FIG. 6B illustrates a conventional index pattern AM1. FIG. 6C illustrates a conventional alignment mark WM. FIG. 6D is a view showing signal waveform data from an image sensor. The axis of ordinate represents signal levels while the axis of abscissa represents mark (or pattern) positions. The index pattern AM1 is formed by edges Ega on both ends of the opaque portion as its index patterns. The opaque portion Cr is formed by a transparent material such as quartz coated with chrome or the like. The alignment mark WM in FIG. 6C is assumed to be a three-piece multimark formed by line and space having its duty ratio of 1:1 in the direction of measurement.

Now, the waveform data from the image sensor become as shown at SIG1 in FIG. 6D when the index pattern AM1 and the alignment mark WM are overlapped at a designed position. Among the waveform data at SIG1, the six wave troughs WM1 to WM6 of the WM data corresponding to the alignment mark WM correspond to the edge positions, and the wafer position is determined on the sensor. On the other hand, the two wave troughs of the AMD1 data corresponding to the edge portions at the two locations correspond to the respective edges Ega of the index pattern AM1, and the position of the index pattern is determined on the sensor from these data. More specifically, two positional data are obtained using a slope 1 from the opaque portion to the trough AMa or a slope 2 from the trough AMa to the top of the wafer signal (WM data), and using these data, the pattern position of the index pattern AM1 is determined.

Also, in the off axis alignment method, a linear opaque index pattern as shown in FIG. 6A is provided on a portion of a transparent glass plate, which corresponds to the edges Ega in FIG. 6B. Then, this index plate made of glass plate is provided through an objective lens at a position substantially conjugate with the wafer, and the transparent portion of the index plate and opaque index pattern are illuminated. Therefore, as shown in FIG. 6E, it is possible to obtain such signal as at SIG1' which is similar to the one at SIG1 when the alignment mark WM is positioned between the index patterns AM1. Hence each of the positions being determined.

However, according to the conventional technique described above, the image of the interleaving mark (index pattern) on the reticle or the image signal waveform corresponding to the image of the index pattern in the alignment system in an off axis method is fluctuated depending on the reflection factor of the wafer, the irregularity of the wafer surface, or the like. For example, the intensity difference $h_2$ of the slope 1 and the intensity difference $h_1$ of the slope 2 of the waveform data SIG1 and SIG1' shown in FIG. 6D and 6E, or the inclinations of the slopes 1 and 2 are sensitively fluctuated in response to the difference in the reflection factor of the wafer surface, irregularity of there, or the like (the wafer surface conditions), or the slopes 1 and 2 are distorted depending on the irregularity of the wafer surface.

As a result, it is impossible to detect the pattern positions accurately with a conventional index pattern such as this. Also, there is a problem that a positional detection cannot be performed with a desirable reproducibility.

SUMMARY OF THE INVENTION

In consideration of these problems existing in the conventional art, the present invention is designed, and it is an object of the present invention to provide an apparatus for detecting positions for implementing an accurate positional detection with a desirable reproducibility without being affected by the surface reflection factor, surface irregularity, or any other wafer surface conditions.

In order to achieve the above-mentioned object, according to the present invention, there are provided in an apparatus for detecting positions comprising:

a first imaging optical system for forming the image of a mark on a substrate for a positional detection on a predetermined first imaging plane;

an index plate having a transparent portion arranged on the aforesaid first imaging plane;

an illuminating system for illuminating an opaque index pattern having a predetermined reflection factor on the aforesaid index plate and at the same time, illuminating the aforesaid mark through the aforesaid transparent portion and aforesaid first imaging optical system;

a second imaging optical system for forming the image of the aforesaid mark, which is formed on the aforesaid first imaging plane by the aforesaid first imaging optical system, and the image of the aforesaid index pattern on a predetermined second imaging plane; and image detection means for outputting image signals capable of varying their level with respect to each of the images of the aforesaid index pattern and the aforesaid mark; in which the positional relationship between the aforesaid index pattern and aforesaid mark is detected on the basis of the aforesaid image signals, an auxiliary pattern having a spatial frequency higher than the insulating spatial frequency of the aforesaid second imaging optical system or having a predetermined reflection factor which differs from the aforesaid index pattern, which is provided adjacent to the opaque portion of the aforesaid index pattern on the aforesaid index plate, and signal processing means for specifying the position of the aforesaid index pattern on the basis of the signal portions which vary in accordance with the aforesaid opaque portion and the aforesaid auxiliary pattern among the image signals obtainable from the aforesaid image detection means.

According to the present invention, there is provided adjacent to the index pattern on the opaque index plane having a predetermined reflection factor at a position which is substantially conjugate with the wafer surface, an auxiliary pattern having a spatial frequency higher than the insulating spatial frequency of the detection optical system or having a predetermined reflection factor which differs from the aforesaid index pattern, and the waveform data corresponding to the auxiliary pattern and the opaque portion are regarded as the positional information of the index pattern. The positional detection can hardly be affected by the reflection factor, surface irregularity, or any other wafer surface conditions, hence improving significantly the accuracy of the positional measurement of the index pattern and the measurement reproducibility as well.

Also, the index pattern is structured with the auxiliary pattern having a spatial frequency higher than the insulating spatial frequency of the opaque portion and detection optical system. Thus, it becomes possible to manufacture the opaque portion and auxiliary pattern in the same process at the same time, leading to an easier acquisition of the stable data on the position of the index pattern.

Further, according to the present invention, even if the conjugate relationship between the light receiving plane of the image detection sensor and the index pattern is not exact (that is, even if an image is slightly defocused), there is no great disturbance in its waveform although the contrast between the detection signals of the index pattern is slightly reduced. Accordingly, a highly accurate measurement can be implemented.

BRIEF DESCRIPTION OF THE DRAWINGS

FIG. 4A is a view showing an index pattern according to an embodiment of the present invention.

FIG. 4B is a view showing a wafer alignment mark.

FIG. 4C is a view showing an image signal from an image sensor.

FIG. 6A and FIG. 6B are views showing a conventional index pattern.

FIG. 6C is a view showing a wafer alignment mark.

FIG. 6D and FIG. 6E are views showing image signals from an image sensor.

DETAILED DESCRIPTION OF THE PREFERRED EMBODIMENTS

Figure 1:
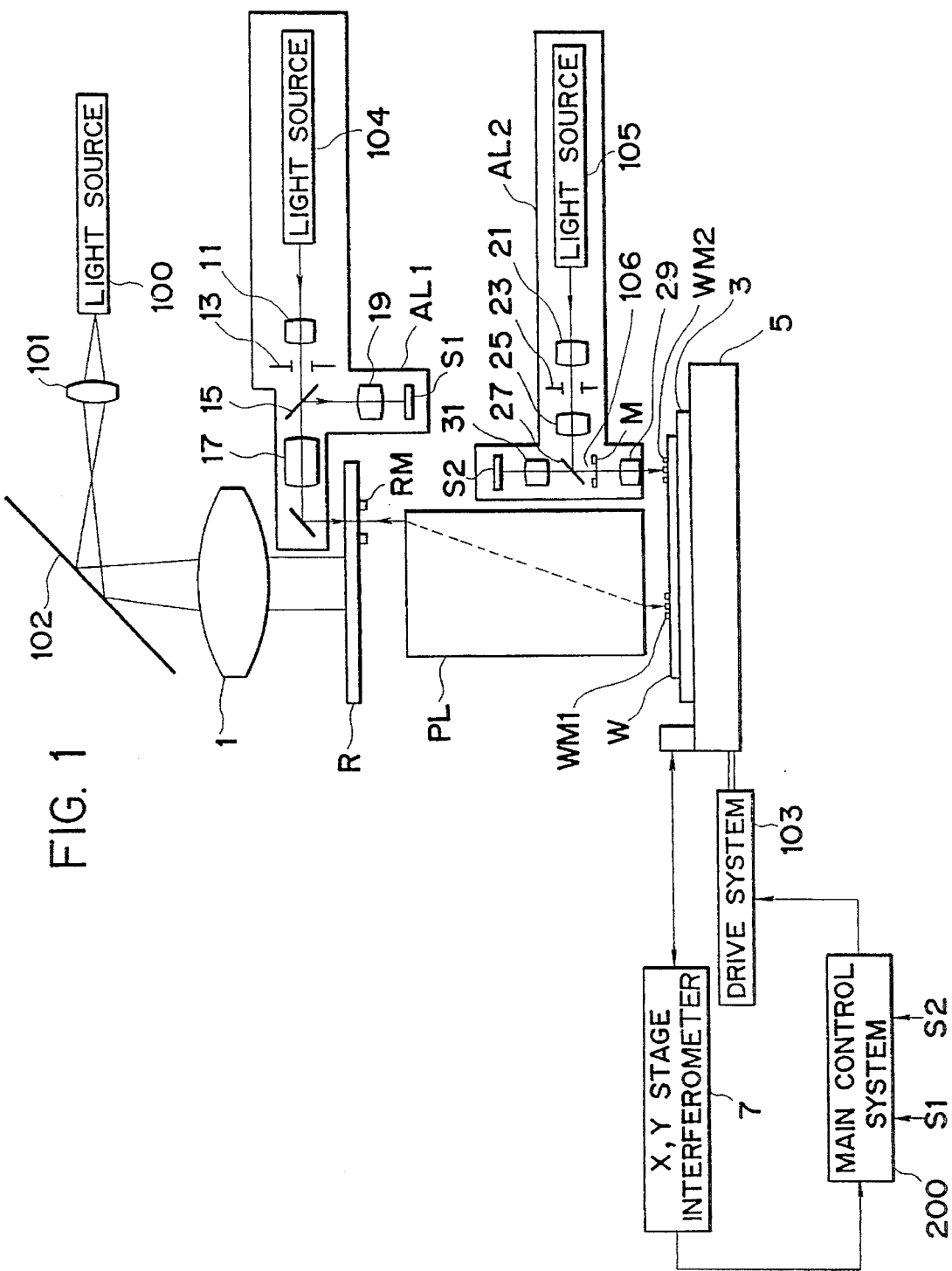
FIG. 1 is a view showing the entire structure of a projection aligner according to an embodiment of the present invention.

Hereinafter, in reference to the accompanying drawings, the embodiments according to the present invention will be described in detail. FIG. 1 is a view showing the entire structure of a projection aligner which is best suited for a first embodiment according to the present invention.

The exposure light, which is emitted from the light source 100, a laser light source of an excimer laser or the like or a line lamp such as a mercury lamp, illuminates a reticle R evenly through an illumination optical system comprising a lens system 101, a mirror 102, and a condenser lens 1. The exposure light passing through the reticle R forms an image on a wafer W through a projection lens PL to cause the pattern on the reticle R to be transferred onto the wafer W through the projection lens PL (first imaging optical system). The wafer W is mounted on a wafer holder 3 on a XY stage 5. The XY stage is capable of being moved two dimensionally by a driving system 103 formed by a motor and other parts. The two dimensional positions of the XY stage 5 are measured by an XY stage interferometer 7. The resultant data are transmitted to a main control system 200. The main control system 200 controls the driving system 103 on the basis of such data.

Figure 2:
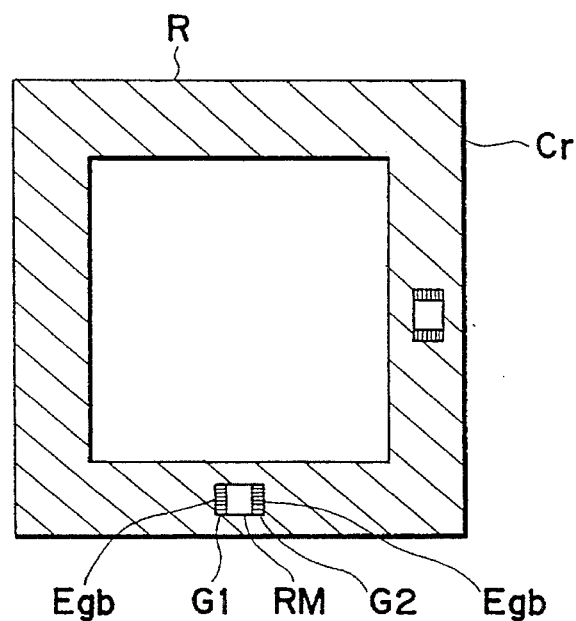
FIG. 2 is a view showing the position of an index pattern on a reticle.

Now, the alignment system AL1 of the TTR (through-the-reticle) method measures directly the alignment mark RM on the reticle R and the alignment mark WM1 on the wafer through the projection lens PL using the light which has substantially the same wavelength of the exposure light. The alignment mark RM comprises the opaque portion and aperture of the reticle R, and the gratings G1 and G2 provided on the opaque portions Cr having a predetermined reflection factor on both sides of the aperture in the direction of the measurement as shown in FIG. 2. The opaque portions Cr are made of a light shielding material having a comparatively high reflection factor such as chrome. In other words, the alignment mark RM (index pattern) is such that there are provided the gratings G1 and G2 on the opaque portions Cr on the both sides of the edge Ega of the conventional index pattern AM1 (FIG. 6B), and the gratings G1 and G2 constitute an auxiliary pattern of a diffraction grating type formed with the opaque portion and transparent portion.

Also, the linear portions Egb of the gratings G1 and G2 in their longitudinal direction are provided adjacent to the opaque portions Cr, and the pitches of the gratings G1 and G2 are narrower than the resolution power (insulating or cut-off spatial frequency) of the detection systems 17 and 19 having the wavelength of illumination light emitted from the light source 104 for detecting the index pattern and alignment mark. In other words, the gratings G1 and G2 are patterns having the spatial frequency which is higher than the insulating spatial frequency of the detection optical system (second imaging optical system. In this respect, the material of the opaque portions of the gratings G1 and G2 should be the same as the material of the opaque portion Cr. By making both materials the same, it is possible to obtain an advantage that they can be manufactured in the same process at the same time.

Light from light source 104 forms an image of alignment mark WM1 on the reticle plane (first imaging plane) through projection lens PL. The alignment mark WM1 is assumed to be a three-piece multimark formed by lines and spaces and having its duty ratio of 1:1 in the direction of measurement. In this respect, the alignment mark is not limited to three pieces. Its number can be one or four or more. Also, there is no problem even if the duty ratio is deviated from 1:1.

Also, in the TTR alignment system AL1, there are included an emission outlet for the alignment light which is conducted from the light source 104 such as an excimer laser light source, a relay lens 11 for relaying the light from the emission outlet, a field diaphragm 13, a first objective lens 17 for coupling the field diaphragm 13 and reticle surface in the conjugate relationship, a half mirror 15 for branching the returning light from the wafer W through the reticle R from the light carrier system, and a second objective lens 19 for forming an image of the alignment marks on an image sensor S1 such as a one dimensional array sensor or CCD. The image of the reticle mark RM and the image of the wafer mark WM are projected through the second objective lens 19 onto the image sensor S1 for the image formation thereon (at a second imaging plane).

Also, in this projection aligner, the alignment system AL2 of the off axis method is installed. The alignment system AL2 of the off axis method is such that the alignment mark WM2 on the wafer is detected through an objective lens 29 which is different from the projection lens PL using a non-exposure light. In the off axis alignment system, the light from the light source 105 which emits the non-exposure light illuminates the field diaphragm 23 through the relay lens 21. For the light source wavelength (non-exposure wavelength) for the off axis alignment, the visible region to the infrared region (approximately 550 nm to 900 nm) of the continuous component of a halogen lamp or mercury lamp is used because the interference effect is reduced by the resist film. The field diaphragm 23 regulates the illuminating field on the wafer W, and the image of the field diaphragm is formed on the wafer W through the relay lens 25, half mirror 27, index plate 106, and objective lens 29. Thus, the illuminated field on the wafer W is regulated by the field diaphragm 23 and only the circumference of the alignment mark WM2 on the wafer W is illuminated. Also, the alignment mark WM2 is assumed to be the same multimark as the alignment mark WM1. An index plate 106 is arranged at a position substantially conjugate with the wafer W with respect to the objective lens 29.

Figure 3:
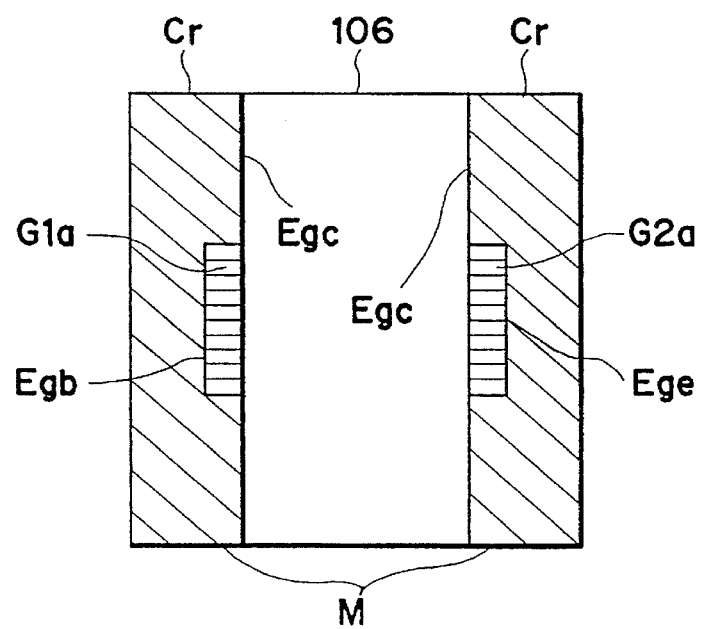
FIG. 3 is a view showing the position of an index pattern on an index plate of an off axis method.

The index plate 106 is made of a transparent glass plate, and as shown in FIG. 3, an opaque portion Cr having a predetermined reflection factor is provided thereon. On the edge Egc of the opaque portion Cr on the light shielding side (measurement direction), the gratings G1a and G2a are provided, and the index pattern M comprises the gratings G1a and G2a provided for the opaque portion Cr and opaque portion Cr. The opaque portion Cr is formed by a light shielding material having a comparatively high reflection factor such as chrome, and the gratings G1a and G2a are an auxiliary pattern of a diffraction grating type comprising an opaque portion and a transparent portion. The opaque portions of the gratings G1a and G2a are assumed to be formed by the same material of the opaque portion Cr.

Further, the linear portion Egb of the gratings G1a and G2a in their longitudinal direction are provided adjacent to the opaque portion Cr, and the pitches of the gratings G1a and G2a are narrower than the resolution power (insulating spatial frequency) of the detection optical system 31 having the wavelength of the illumination light emitted from the light source 105 for detecting the index pattern and alignment mark. In other words, the gratings G1a and G2a are patterns having a higher spatial frequency than the insulating spatial frequency of the detection optical system.

Now, the returning light from the alignment mark WM2 is imaged on the image sensor S2 such as a one dimensional array sensor or CCD through the objective lens 29, index plate 106, half mirror 27, and the second object lens 31. The index plate 106 is arranged in a relationship substantially conjugate with the wafer with respect to the objective lens 29 while the second objective lens 31 is the one which images the image of the index pattern M on the image sensor S2. Consequently, the images of the alignment mark WM2 and index pattern M are formed on the image sensor S2 through the second objective lens 31. In FIG. 1, while a projection aligner having the TTR alignment system AL1 and off axis alignment system AL2 is described, there is no problem even if the aligner has either one of them only.

Subsequently, the description will be made of image signals obtainable from a reticle mark RM (index pattern) and an index pattern M according to an embodiment of the present invention.

At first, in reference to FIG. 4, the reticle alignment mark RM will be described. FIG. 4A represents an alignment mark RM according to an embodiment of the present invention and FIG. 4B represents an alignment mark WM1. Then, FIG. 4C shows the signal waveforms from an image sensor S1 corresponding respectively to the alignment mark RM and alignment mark WM1 when they are overlapped. The ordinate axis of the FIG. 4C represents signal levels while the abscissa axis represents mark positions.

The waveform data SIG2 shown in FIG. 4C are obtained when the wafer mark WM1 shown in FIG. 4B is overlapped between the gratings G1 and G2 provided for the alignment mark RM.

Here, signal waveform data AMD2, which correspond to the index pattern including the grating G1 and G2, are important. The bottom levels of the data AMD2 become substantially constant value irrespective of the wafer surface condition such as the wafer reflection factor and wafer surface irregularity owing to the fact that the gratings G1 and G2 are a pattern having a higher spatial frequency than the insulating spatial frequency of the detection optical system (the first objective lens 17 and the second objective lens 19), and the slope 1 becomes stable because there is almost no effect produced thereon by the wafer surface condition such as the wafer surface reflection factor and wafer surface irregularity. Here, the signals from the image sensor S1 are inputted into the main control system 200 together with the positional measurement signals from the interferometer 7. In the main control system 200, a circuit for binarizing the positional measurement signals per pixel at a predetermined slice level using the slope 1, in which half a value of the intensity difference $h_2$ is binarized as a slice level SV using the slope 1, for example, to obtain the position of the index mark in the measurement direction from such value. As a result, it is possible to implement an accurate and extremely high measurement reproducibility. On the other hand, the main control system 200 obtains the position of the wafer mark WM1 on the sensor in accordance with the WM data. Further, the main control system 200 obtains the relationship between the positions of the index mark and wafer mark.

Likewise, regarding the index pattern M of the off axis alignment system, the signal waveform SIG2 shown in FIG. 4C is obtained when the wafer alignment mark WM2 is overlapped between the gratings G1a and G2a. The bottom levels of the data AMD2 become substantially constant value irrespective of the wafer surface condition such as the wafer reflection factor and wafer surface irregularity because the gratings G1 and G2 are a pattern with pitches which are of a higher spatial frequency than the insulating spatial frequency of the detection optical system (the second objective lens 31) having the wavelength of the illuminating light emitted from the light source 105 for detecting the index pattern and the alignment mark, and the slope 1 becomes stable since there is almost no effect produced thereon by the wafer surface condition such as the wafer surface reflection factor and wafer surface irregularity. As a result, it becomes possible to implement an accurate and extremely high measurement reproducibility.

Hereunder, the signal intensity ratio of the signals which correspond to the opaque portion of the index pattern and grating G1 or G2 (G1a or G2a) quantitatively is estimated. In this respect, the reticle alignment mark RM and the index pattern M are referred to as index pattern AM2 without any distinction in the description set forth below. Also, the alignment marks WM1 and WM2 formed on the wafer are referred to as wafer alignment mark WM without any distinction. Likewise, the gratings G1 and G1a, and G2 and G2a are referred to as G(1) and G(2) without any distinction.

Now, given the reflection factor of the opaque portion as 40%, the transmittance of the optical system between the index pattern AM2 and alignment mark WM as 90% per one way, and the wafer reflection factor as 50%, and when the insulating spatial frequency of the optical system between the index pattern AM2 and alignment mark WM and the insulating spatial frequency of the detection optical systems (17, 19, and 31) are converted to the scale on the index pattern AM2, it is assumed that both of them are the same. Then, the grating pattern G(1) or G(2) of a high spatial frequency is assumed to have a line and space duly of 1:1. At this juncture, the 0th reflection luminous intensity and 0th transparent luminous intensity are both a ¼ of the intensity of the incident light from grating G(1) or G(2), and others become diffraction rays of light to be shielded by the optical system.

Accordingly, the signal intensity ratio of the opaque portion to the grating portion is given below.

$$40\%: 40\% \times \frac{1}{4} + \frac{1}{4} \times (90\%)^2 \times 50\% \times \frac{1}{4} \cong 3:1 \quad \ldots(1)$$

Therefore, the effects of the wafer surface reflection factor and wafer surface irregularity can be reduced significantly. Hence obtaining AMD2 data having a substantially constant contrast without being affected by the wafer surface reflection factor and other wafer surface conditions. With the slope 1 thus stabilized, the measurement reproducibility is also improved.

Figure 5A:
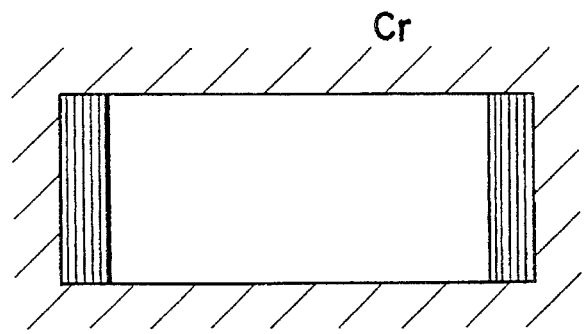
FIGS. 5A through 5D are views showing a variation of the index pattern.
Figure 5B:
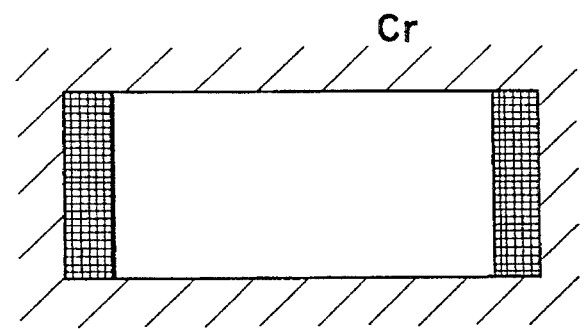
Figure 5C:
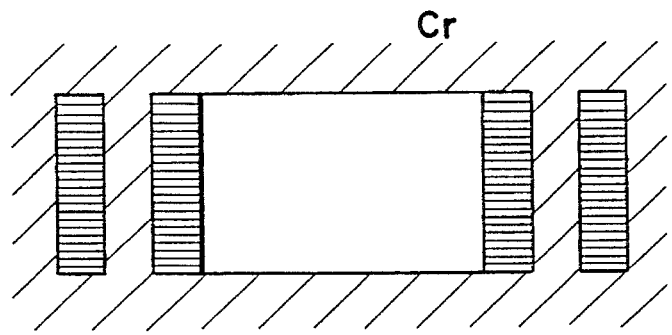

Now, an example of a variation of the index pattern AM2 will be described in reference to FIG. 5. While in FIG. 4 the pitch direction of the grating is regarded as its non-measurement direction, it may be possible for the grating to adopt its pitch direction for the measurement direction as shown in FIG. 5A. Also, as shown in FIG. 5B, it is possible to enhance the contrast further by making the grating a checkered pattern. Moreover, as shown in FIGS. 5C and 5D, it is possible to improve the accuracy more by means effects if the gratings G(1) and G(2) are provided in a plurality to obtain multi patterns.

Figure 5D:
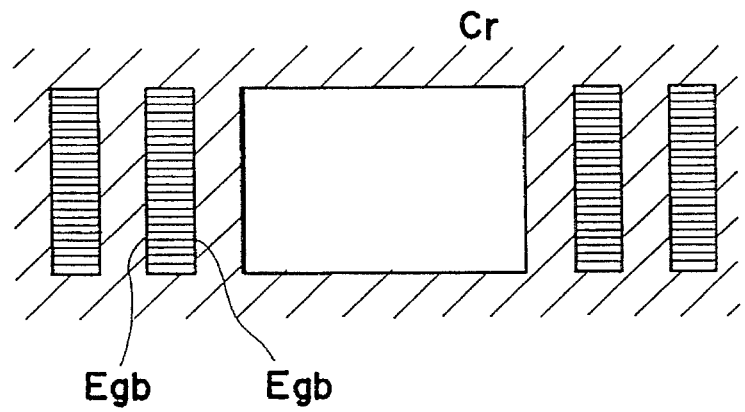

Also, it is possible to obtain two stable slopes (slope 1 and 2') by providing both of the two linear portions Egb of one grating adjacent to the opaque portion Cr as shown in FIG. 5D. When the grating shown in FIG. 5D is used, both of the slope 1 and slope 2' are of slope signals obtainable between the linear portion Egb and opaque portion. Therefore, at the time of a positional detection of the index pattern AM2, the slope 1 or 2', or both can be selected arbitrarily. FIG. 5D represent the multi patterns thus formed by arranging both of the linear portions Egb adjacent to the opaque portion. In this way, a further improvement of the alignment accuracy can be expected.

In this respect, it is needless to mention that the effect of the alignment mark according to the present invention is shown when the opaque portion of the index pattern has a reasonably large reflection factor with respect to the alignment light.

Also, in the present embodiment, while the pattern of a high spatial frequency is made by a grating type pattern having specific pitches, such a pattern is not necessarily of a grating type if only its spatial frequency spectrum is higher than the insulating frequency. Also, in the aforesaid equation (1), no effects resulting from a high order diffraction light which enters the projection lens PL and the objective lens 29 are added. If the effects are to be taken into account, the grating should only be formed with the pitch which has a frequency higher than the spatial frequency of the projection lens PL and the objective lens 29. In this case, any high order diffraction light cannot enter the projection lens. Therefore, the returning light from the wafer is only 0th diffraction light, so that the signal intensity of the grating portion is further reduced.

Also, the aforesaid gratings G(1) and G(2) may be formed with a phase shifter. If the gratings G(1) and G(2) are formed with a phase shifter, no 0th diffraction light is generated, making it possible to reduce the signal intensity of the grating portion more. Particularly, by enabling the pitch of the grating which is formed with a phase shifter to be of a frequency component higher than the spatial frequency of the projection lens PL, it is possible to make the signal intensity of the grating portion substantially zero. As a result, the signal AMD2 which has a specific contrast depends only on the reflection factor of the opaque portion.

Also, in the region corresponding to the aforesaid grating portion, an opaque portion having the reflection factor of the opaque portion Cr and a specific reflection factor difference may be provided or a substance having a light absorbency against the light for detecting positions may be provided. Thus, it becomes possible to obtain the signal AMD2 which has a specific contrast.

What is claimed is:

1. An apparatus for detecting positions comprising:

(a) a first imaging optical system for forming the image of a mark on a substrate for a positional detection on a predetermined first imaging plane;

(b) an index plate arranged on said first imaging plane and having an index pattern including an opaque portion with a predetermined reflection factor and a transparent portion, and having an auxiliary pattern;

(c) an illumination system for illuminating said index plate and for illuminating said mark through said transparent portion and said first imaging optical system;

(d) a second imaging optical system for forming the image of said mark and the image of said index pattern on a predetermined second imaging plane;

(e) an image sensor arranged on said second imaging plane, for outputting image signals capable of varying their level with respect to said index pattern and said mark and said auxiliary pattern, respectively; and (f) a signal processing system for determining the position of said mark on the basis of an image signal portion in accordance with said mark and the position of said index pattern on the basis of an image signal portion which varies in accordance with said opaque portion of said index pattern and said auxiliary pattern, wherein said auxiliary pattern is constructed to produce a signal level that is substantially independent of the surface condition of said substrate and said auxiliary pattern has at least one edge adjacent to said opaque portion of said index pattern, and said apparatus for detecting positions detects the positional relationship between said mark and said index pattern.

2. An apparatus according to claim 1, wherein said auxiliary pattern has a spatial frequency higher than the cut-off spatial frequency of said second imaging optical system.

3. An apparatus according to claim 2, wherein said auxiliary pattern is a pattern of a grating type.

4. An apparatus according to claim 2, wherein said auxiliary pattern is of a grating with a phase shifter.

5. An apparatus according to claim 1, wherein said auxiliary pattern is an opaque pattern having a predetermined reflection factor which differs from that of said opaque portion of said index pattern.

6. An apparatus according to claim 1, wherein said auxiliary pattern is a light absorber having light absorption with respect to the light from said illumination system.

7. An apparatus according to claim 1, wherein a bottom level of said image signal portion in accordance with said auxiliary pattern is a substantially constant value.

8. An apparatus according to claim 1, wherein said opaque portion of said index pattern and said auxiliary pattern are formed by the same material.

9. An apparatus according to claim 1, wherein said signal processing system determines the position of said index pattern on the basis of said image signal portion in accordance with said edge of said auxiliary pattern.

10. An apparatus for detecting positions comprising:

(a) a substrate having a mark;

(b) an index plate having an index pattern and an auxiliary pattern;

(c) an imaging optical system for forming the image of said mark and the image of said index pattern on a predetermined imaging plane;

(d) an image sensor arranged on said imaging plane, for outputting image signals with respect to said mark, and said auxiliary pattern, said auxiliary pattern being constructed to produce a signal level that is substantially independent of the surface condition of said substrate; and (e) a signal processing system for determining the position of said mark and the position of said auxiliary pattern on the basis of said image signals.

* * * * *